United States Patent
Khakifirooz et al.

(10) Patent No.: US 8,507,989 B2
(45) Date of Patent: Aug. 13, 2013

(54) EXTREMELY THIN SEMICONDUCTOR-ON-INSULATOR (ETSOI) FET WITH A BACK GATE AND REDUCED PARASITIC CAPACITANCE

(75) Inventors: Ali Khakifirooz, Mountain View, CA (US); Kangguo Cheng, Schenectady, NY (US); Bruce B. Doris, Brewster, NY (US)

(73) Assignee: International Business Machine Corporation, Armonk, NY (US)

( * ) Notice: Subject to any disclaimer, the term of this patent is extended or adjusted under 35 U.S.C. 154(b) by 123 days.

(21) Appl. No.: 13/108,282

(22) Filed: May 16, 2011

(65) Prior Publication Data
US 2012/0292700 A1    Nov. 22, 2012

(51) Int. Cl.
  *H01L 27/12*    (2006.01)
  *H01L 29/786*    (2006.01)
  *H01L 29/66*    (2006.01)

(52) U.S. Cl.
  USPC ........... 257/347; 257/348; 257/354; 257/365; 257/E27.112; 257/E29.242; 257/E29.275; 257/E29.283

(58) Field of Classification Search
  None
  See application file for complete search history.

(56) References Cited

U.S. PATENT DOCUMENTS

| | | | |
|---|---|---|---|
| 7,129,123 B2 | 10/2006 | Sakurada et al. | |
| 7,202,123 B1 | 4/2007 | Pan | |
| 7,205,185 B2 | 4/2007 | Dokumaci et al. | |
| 7,250,351 B2 * | 7/2007 | Furukawa et al. | 438/423 |
| 7,273,785 B2 | 9/2007 | Dennard et al. | |
| 7,426,295 B2 | 9/2008 | Yamakado et al. | |
| 7,772,649 B2 | 8/2010 | Cheng et al. | |
| 2009/0212362 A1 * | 8/2009 | Cheng et al. | 257/347 |
| 2010/0258869 A1 * | 10/2010 | Morita et al. | 257/347 |
| 2012/0018806 A1 * | 1/2012 | Furukawa et al. | 257/347 |
| 2012/0168863 A1 * | 7/2012 | Zhu et al. | 257/347 |
| 2012/0261792 A1 * | 10/2012 | Cheng et al. | 257/510 |

FOREIGN PATENT DOCUMENTS
DE    102 97 679 T5    5/2005
WO    03/083934    9/2003

* cited by examiner

*Primary Examiner* — Michael Jung
(74) *Attorney, Agent, or Firm* — H. Daniel Schnurmann (57) ABSTRACT

An extremely thin SOI MOSFET device on an SOI substrate is provided with a back gate layer on a Si substrate superimposed by a thin BOX layer; an extremely thin SOI layer (ETSOI) on top of the thin BOX layer; and an FET device on the ETSOI layer having a gate stack insulated by spacers. The thin BOX is formed under the ETSOI channel, and is provided with a thicker dielectric under source and drain to reduce the source/drain to back gate parasitic capacitance. The thicker dielectric portion is self-aligned with the gate. A void within the thicker dielectric portion is formed under the source/drain region. The back gate is determined by a region of semiconductor damaged by implantation, and the formation of an insulating layer by lateral etch and back filling with dielectric.

17 Claims, 6 Drawing Sheets

EXTREMELY THIN SEMICONDUCTOR-ON-INSULATOR (ETSOI) FET WITH A BACK GATE AND REDUCED PARASITIC CAPACITANCE

FIELD OF THE INVENTION

The present invention relates generally to semiconductor devices, and more particularly, to a device formed on a semiconductor-on-insulator substrate having a back gate and reduced parasitic capacitance, and a method of forming the same.

BACKGROUND

In order to fabricate integrated circuits (ICs), such as memory devices and logic devices of higher integration density than currently feasible, one has to find ways to further downscale the dimensions of field effect transistors (FETs), such as metal-oxide-semiconductor field effect transistors (MOSFETs). Scaling achieves compactness and improves operating performance in devices by shrinking the overall dimensions of the device while maintaining the device's electrical properties. Additionally, all dimensions of the device are typically scaled simultaneously in order to optimize the electrical performance of the device.

As the size of MOSFETs and other devices decreases, the dimensions of source/drain regions, channel regions, and gate electrodes of the devices, also decrease. The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a thickness of about 30 nm to 100 nm, are generally required for acceptable performance in short channel devices. Silicon-on-insulator (SOI) technology allows the formation of high-speed, shallow junction devices. In addition, SOI devices improve performance by reducing parasitic junction capacitance.

In an SOI substrate, a buried oxide (BOX) film made of silicon oxide is formed on single crystal silicon, and a single crystal silicon thin film is formed thereon. Various methods of fabricating such SOI substrates are known, one of which is Separation-by-Implanted Oxygen (SIMOX), wherein oxygen is ion implanted into a single crystal silicon substrate to form a BOX film. Another method of forming an SOI substrate is by wafer bonding, wherein two semiconductor substrates with silicon oxide surface layers are bonded together at the silicon oxide surfaces to form a BOX layer between the two semiconductor substrates.

Scaling CMOS devices has pushed the number of parameters out of a negligible region to the point of becoming a significant circuit design factors. One of the important device parameters is the short-channel control. Fully depleted silicon-on-insulator (FDSOI) devices are a new class of MOSFETs where the short channel control is achieved by making the transistor channel thin. Extremely thin Silicon-On-Insulator (ETSOI), is a fully depleted SOI transistor device that uses an ultra-thin silicon channel wherein the majority carriers are fully depleted (FD) during operation. Typically, the thickness of an ETSOI layer ranges from 3 nm to 20 nm. In an ETSOI device since the junction depth is essentially equal to the thickness of the ultrathin silicon channel a very shallow junction is achieved. Hence, ETSOI offers superior short channel control compared to conventional MOSFETs.

Unlike conventional MOSFETs, where high doping concentration in the channel is needed to control the short channel effects, in an ETSOI device there is no need to channel doping. This leads to better device matching in ETSOI devices compared to conventional MOSFETs due to the fact that there is no dopant-fluctuation effect in undoped channel ETSOI.

In addition, it is desired that the ETSOI device is fabricated with a thin buried oxide (BOX) and a back gate is formed underneath the BOX. The back gate can be formed for example by doping the substrate underneath the BOX. In an ETSOI transistor with a back gate and thin BOX, the electrical characteristics of the MOSFET can be controlled by applying a voltage to the back gate. By doing so, the threshold voltage of the ETSOI transistor is changed and as a result the transistor current in the off- and on-states is modulated.

Such modulation of the electrical characteristics of the MOSFET by a voltage applied to the back gate finds many applications, including power management, reduction in the chip-to-chip device variation, and fine tuning of the chips after manufacturing. Multiple Vt devices can also be achieved by applying different back bias at the back gate.

Generally, a prior art back gate butting the entire device including channel and source/drain regions, results in a large parasitic capacitance, i.e., (source/drain back gate overlap capacitance). This disadvantageously decreases the transistor speed and increases the power consumption.—This is also ok here, describes the problem with the prior art.

Figure 1:
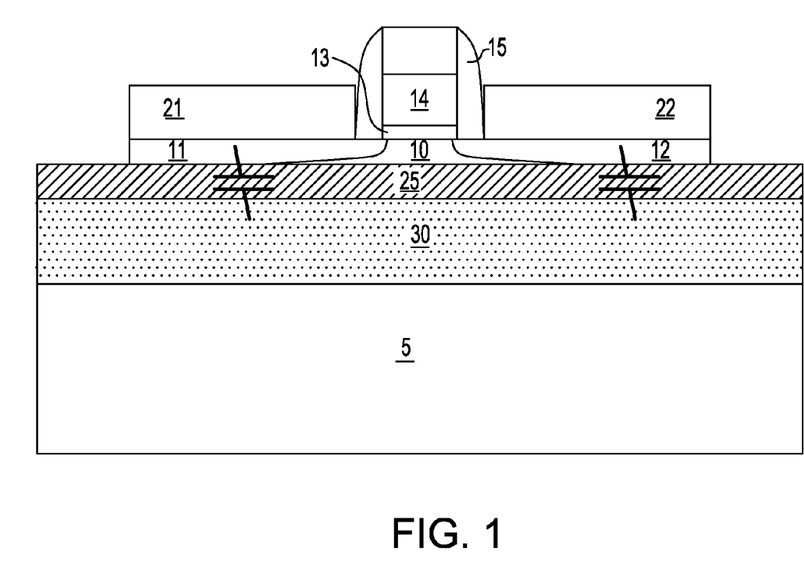
FIG. 1 is a side cross-sectional view of a prior art ETSOI device including a back gate spanning across the entire device including a channel and source/drain regions.

Referring to FIG. 1 a side cross-sectional view of an illustrative prior art MOSFET device 100 is shown formed on a semiconductor-on-insulator (SOI) substrate having a raised source/drain (S/D) 21, 22 formed atop the source and drain regions 11, 12. The illustrative structure forms a semiconductor FET device on the semiconductor-on-insulator (SOI) substrate having an extremely thin semiconductor-on-insulator layer (ETSOI). The ETSOI layer is deposited atop the buried oxide layer 25, the ETSOI layer having a thickness preferably ranging from 3 nm to 20 nm. The raised source regions and raised drain regions are formed on an upper surface of ETSOI layer 20 in which the semiconductor is present, and which are formed using an epitaxial deposition process. A back gate region 30 is formed underneath the buried oxide 20 for example by implanting dopant atoms into the substrate 40 and annealing.

The prior art ETSOI semiconductor device includes a back gate 30 butting across the entire device including a channel 10 and source and drain region 11,12.

The disadvantage of such a constructed device, particularly referring to back gate layer 30 is that it displays a significant parasitic capacitance between the back gate 30 and source and drain region 11, 12.

Several methods have been proposed in the art to reduce the parasitic capacitance between the back gate and the source and drain regions, such as a method for implanting fluorine atoms into the buried oxide region directly underneath the source and drain. However, due to finite scatter in the position of the fluorine ions, known as lateral implant straggle, some of the implanted atoms are also formed underneath the channel. This is especially important in deeply scaled MOSFETs where the spacing between the source and drain region, i.e. the channel length, has a length comparable to the thickness of the buried oxide.

Although it is known in the art the use of a back gate for a fully depleted SOI technology, as described above the parasitic capacitance between the back gate and the source and drain region is high. The prior art attempts to reduce the parasitic capacitance but it has not been found to be suitable for a deeply scaled MOSFET.

SUMMARY

In one embodiment of the invention, an ETSOI MOSFET device is illustrated having a thin buried oxide (thin BOX) and a back gate, wherein the semiconductor device shows a substantially reduced capacitance between the back gate and the source/drain regions.

In one embodiment, the MOSFET device is provided with a thin BOX under the ETSOI channel and a thicker dielectric under the source and drain that reduces the source/drain to back gate parasitic capacitance. The thicker dielectric portion is self-aligned with the gate.

In one embodiment, a void is formed within the thicker dielectric portion formed underneath the source/drain region.

In one embodiment, the invention provides a back gate determined by a region of semiconductor damaged by implantation, and the formation of an insulating layer by a lateral etch and back fill with a dielectric. Furthermore, the etch region is formed in an SOI substrate and backfilled with an insulator.

In one embodiment, the invention provides a semiconductor device on an SOI substrate having a back gate layer on a Si substrate superimposed by a thin BOX layer; an extremely thin SOI layer (ETSOI) on top of the thin BOX layer; and an FET device on the ETSOI layer having a gate stack insulated by spacers.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

When describing the following structures and methods, the following terms have the following meanings, unless otherwise indicated.

As used herein, the term "raised" in combination with source and/or drain denotes that the source and/or drain region is formed on a semiconductor material layer that is present on an upper surface of the substrate on which the gate dielectric is present.

As used herein, the term "single crystal material" denotes a crystalline solid, in which the crystal lattice of the entire sample is continuous and substantially unbroken to the edges of the sample, with substantially no grain boundaries.

"Epitaxial growth and/or deposition" means the growth of a semiconductor material on a deposition surface of a semiconductor material, in which the semiconductor material being grown has the same crystalline characteristics as the semiconductor material of the deposition surface.

The term "direct contact" or "directly on" means that a first element, such as a first structure, and a second element, such as a second structure, are physically in contact without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

Figure 2:
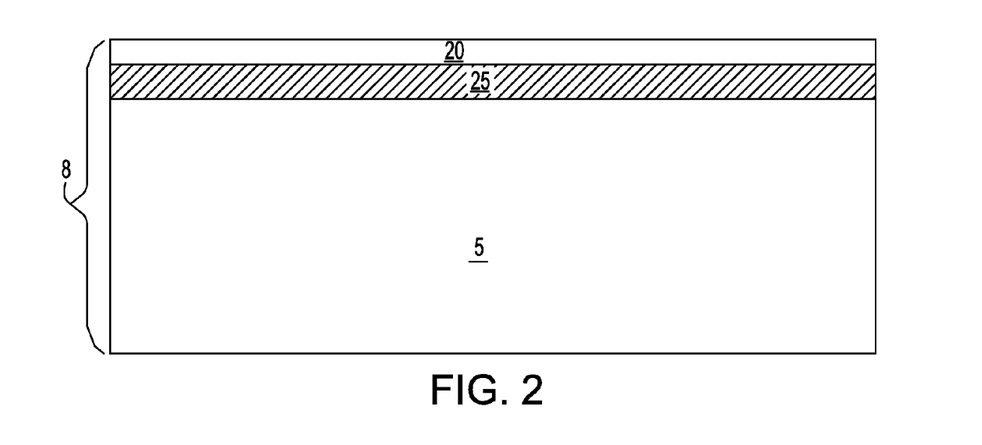
FIG. 2 shows a side cross-sectional view depicting a substrate having a thin BOX layer overlaying the substrate and an ETSOI layer atop the thin BOX, forming an ETSOI substrate, in accordance with one embodiment of the present invention.

FIG. 2 depicts an extremely thin semiconductor-on-insulator (ETSOI) substrate 8 having a first semiconductor layer 20 atop a buried insulator layer 25 which is formed on top of a substrate 5. The semiconductor layer 20 may be formed using any semiconductor material including, but not limited to Si, SiGe, SiGeC, SiC, Ge alloys, GaSb, GaP, GaAs, InAs, InP, and all other III-V or II-VI compound semiconductors, or a combination thereof.

In one embodiment, semiconductor layer 20 is typically silicon or silicon-containing semiconductor, such as SiGe and has a thickness between 3 and 20 nm. The buried insulator 25 is typically silicon dioxide and has a thickness between 10 and 50 nm. In some embodiments, the semiconductor substrate 5 is a bulk semiconductor and typically a single crystal silicon wafer. In other embodiments, the semiconductor substrate 5 may include a layered semiconductor material such as, for example, a semiconductor-on-insulator or a semiconductor on a polymeric, thin, and or flexible substrate. Illustrated examples of semiconductor-on-insulator substrates that can be employed as semiconductor substrate 5 include silicon-on-insulators and silicon-germanium-on-insulators.

The ETSOI substrate 8 can be formed by any of the methods known in art, for example using separation by implanted oxide (SIMOX) process, where oxygen ions are implanted into a silicon substrate at a desired depth. The substrate is then annealed at high temperatures, typically 1300° C. and in an inert ambient with a small amount of oxygen, so that the oxygen-implanted region of the substrate is converted into silicon oxide. In yet another method, the semiconductor-on-insulator substrate is formed by wafer bonding and thinning.

Figure 3A:
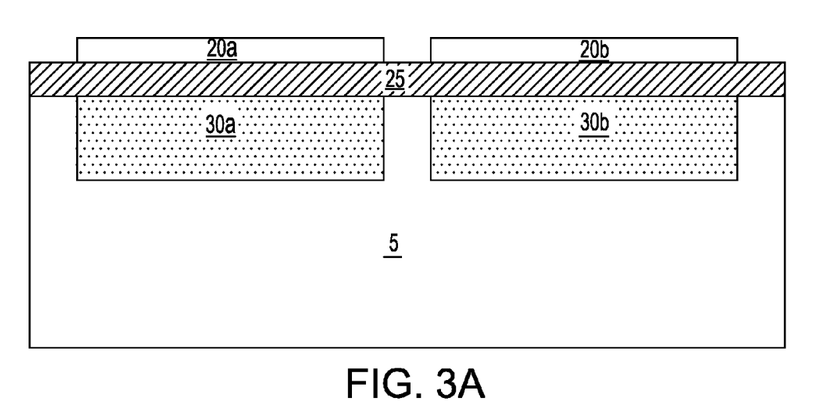
FIGS. 3a-3b are side cross-sectional views depicting forming an isolation region and back gates under the thin BOX showing separate n-well and p-well fabricated by implantation (FIG. 3a) or a common well, on top of the substrate and below the thin BOX (FIG. 3b), in accordance with one embodiment of the present invention.
Figure 3B:
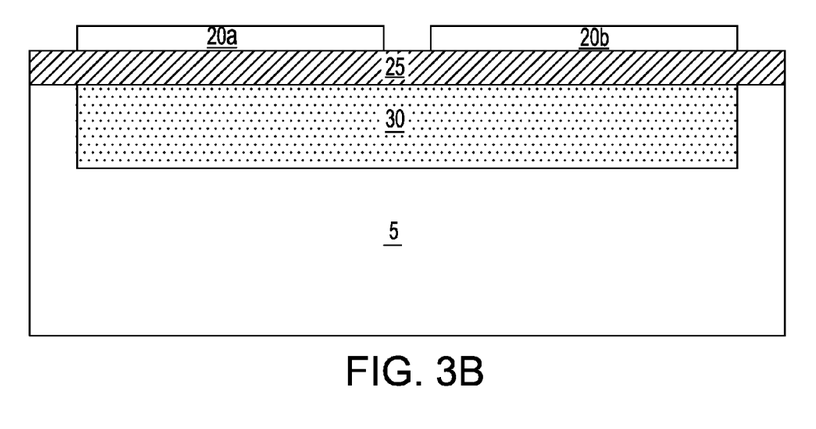

As shown in FIGS. 3a and 3b, a plurality of active regions 20a and 20b are defined in the SOI layer 20. These active regions are defined by lithography and are isolated from each method using a method such as mesa isolation, local oxidation of silicon (LOCOS), or shallow-trench isolation (STI), as known in the art. A plurality of back gate regions is formed underneath the active regions, for example by implanting dopant ions into the substrate and with energy sufficient so that the dopant ions are placed underneath the buried insulator. Typical dopant atoms include arsenic (As) and phosphorus (P) as n-type dopants and boron (B) and indium (In) as p-type dopants. An annealing step is then performed to activate the dopants and remove the defects generated by implantation process in the substrate 5. FIG. 3a shows an embodiment where different back gates 30a, 30b are used for different active regions 20a, 20b, whereas FIG. 3b shows an embodiment where a shared back gate 30 is used for both active regions.

The back gate region preferably has a thickness between 20 nm and 200 nm and an active dopant concentration of more than $1 \times 10^{18}$ cm$^{-3}$, although lesser or greater values can be used.

Figure 4:
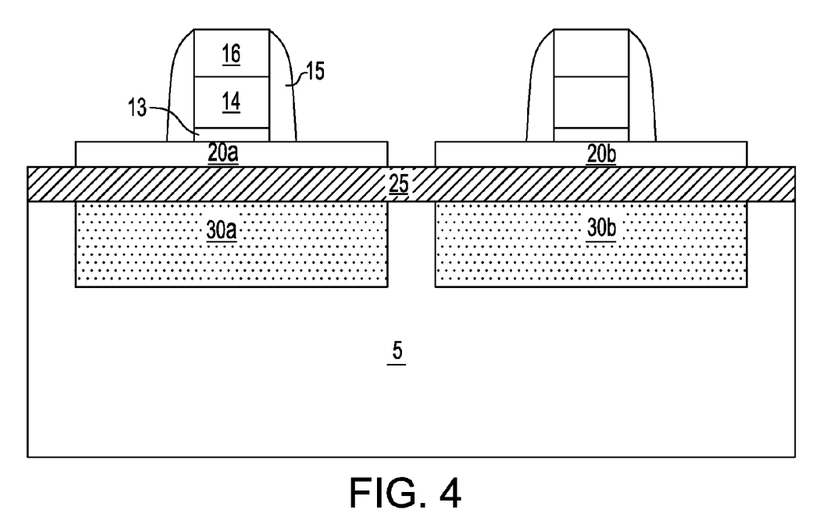
FIG. 4 illustrates process steps including forming a gate bounded by spacers, in accordance with one embodiment of the present invention.

As shown in FIG. 4, a plurality of gate dielectric 13, gate electrode 14, gate cap 16 and spacer regions 15 are then formed on the active regions. The gate dielectric 13 may individually include separate dielectric materials such as oxides, nitrides and oxynitrides of silicon that have a dielectric constant ranging from 3.9 to 10.0, as measured in a vacuum at room temperature. Alternatively, one or both of the first and second gate dielectric 39, 43 may be composed of a higher dielectric constant dielectric material having a dielectric constant ranging from 10 to 100. Such higher dielectric constant dielectric materials may include, but are not limited to, hafnium oxides, hafnium silicates, titanium oxides, barium-strontium-titantates (BSTs) and lead-zirconate-titanates (PZTs). The gate dielectric 13 may be formed using any of several deposition and growth methods, including but not limited to, thermal or plasma oxidation or nitridation methods, chemical vapor deposition methods and physical vapor deposition methods. The gate dielectric 13 may be composed of the same material or different materials. Although the gate dielectric 13 are depicted in the supplied figures as each being a single layer, embodiments have been contemplated in which the gate dielectric 13 are each a multi-layered structure of conductive materials. In one embodiment, the gate dielectric 13 has a thickness ranging from 10 angstroms to 200 angstroms.

The gate conductors 14 may be composed of conductive materials including, but not limited to, metals, metal alloys, metal nitrides and metal silicides, as well as laminates thereof and composites thereof. In one embodiment, the gate conductors 14 may be any conductive metal including, but not limited to, W, Ni, Ti, Mo, Ta, Cu, Pt, Ag, Au, Ru, Ir, Rh, and Re, and alloys that include at least one of the aforementioned conductive elemental metals. The gate conductors 14 may be formed using polysilicon and/or polysilicon-germanium alloy materials (i.e., having a dopant concentration from 1E19 to 1E22 dopant atoms per cubic centimeter) and polycide materials (doped polysilicon/metal silicide stack materials). The gate conductors 14 may be composed of the same material or different materials. The gate conductors 14 may be formed using a deposition including, but not limited to salicide methods, atomic layer deposition methods, chemical vapor deposition methods and physical vapor deposition methods, such as, but not limited to, evaporative methods and sputtering methods. Although The gate conductors 14 are depicted in the supplied figures as each being a single layer, embodiments have been contemplated in which The gate conductors 14 are each a multi-layered structure of conductive materials. In one embodiment, the gate conductor 14 has a thickness ranging from 100 angstroms to 1000 angstroms.

Spacers 15 may be composed of dielectric materials, and are typically formed using a blanket layer deposition and anisotropic etchback. Although the spacers 15 are depicted in the figures as each being a single layer, embodiments have been contemplated in which the spacers 15 are each a multi-layered structure of conductive materials. In one embodiment, the spacers are composed of silicon nitride and have a thickness ranging from 1 nm to 10 nm.

The gate cap 16, which may be optional, is preferably composed of dielectric materials. The gate cap 16 is typically formed using a blanket layer deposition and anisotropic etchback. Although the spacers 15 are depicted as each being a single layer, embodiments have been contemplated in which the gate cap 16 is a multi-layered structure of conductive materials. In one embodiment, the gate cap 16 is composed of silicon nitride with a thickness ranging from 1 nm to 10 nm.

Figure 5:
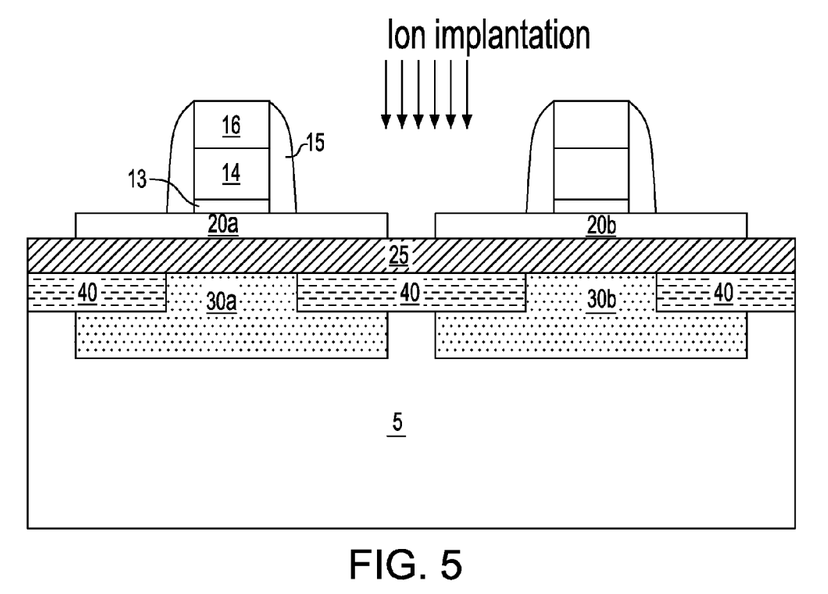
FIG. 5 is a side cross-sectional view depicting ion implantation into the substrate under the BOX, the gate blocking the implantation into the substrate under the channel region, in accordance with one embodiment of the present invention.

Ion implantation is then performed to form modified regions 40 inside the substrate 5. Ion implantation is masked by the gate 14 and spacer regions 15. Thus, the modified regions 40 are self-aligned to the gate and channel. Gate electrode 14 is protected by cap layer 16 from ion implantation. Regions 40 are modified so that the etch rate of these regions in subsequent etch steps is much higher than the unmodified regions of the substrate 5. For example, a single-crystalline silicon substrate can be implanted with xenon (Xe), arsenic (As), or germanium (Ge) or can be amorphized by increasing its etch rate by at least one order of magnitude. In one embodiment, the implanted species is Xe with an implant dose ranging from 4E13 cm-2 to of 1E15 cm-2 and an implant energy ranging from 30 KeV to 200 Kev. In one embodiment, the implanted species is Ge with an implant dose ranging from $5e^{13}$ cm$^{-2}$ to $2e^{15}$ cm$^{-2}$ and an implant energy ranging from 30 Kev to 200 Kev.

Figure 6:
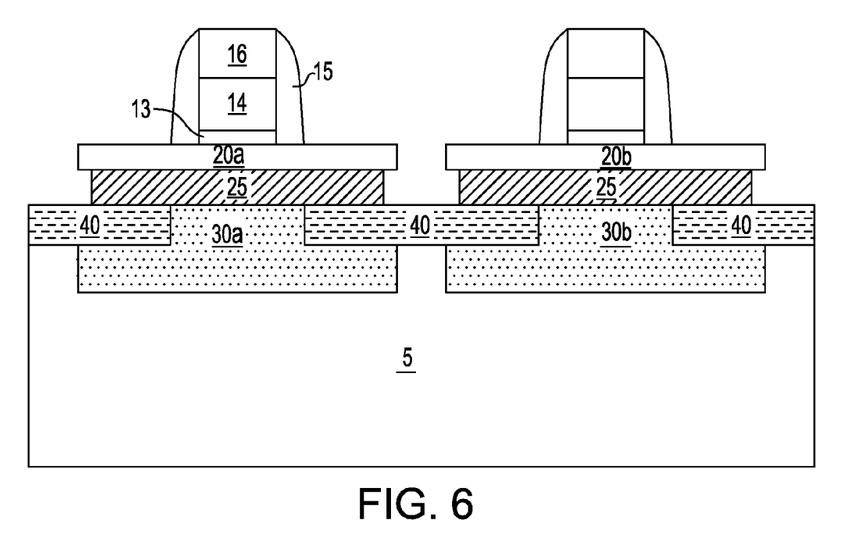
FIG. 6 shows a side cross-sectional view depicting etching the thin BOX to expose the implanted region underneath the BOX, in accordance with one embodiment of the present invention.

Referring to FIG. 6, the buried insulator 25 is etched away in the area between the active regions 20a, 20b. This can be done by way of any of the isotropic or anisotropic etching to etch the buried insulator material. With a typical buried insulator composed of silicon dioxide, the material can be etched, e.g., with wet etch in an HF-containing solution, such as buffered HF (BHF) or diluted HF. Another preferable oxide etch process is by chemical oxide removal (COR). Alternatively, the oxide can be etched with an anisotropic etch such as reactive ion etching. After this step, the top of the modified region 40 is exposed in the area between the active regions.

Figure 7:
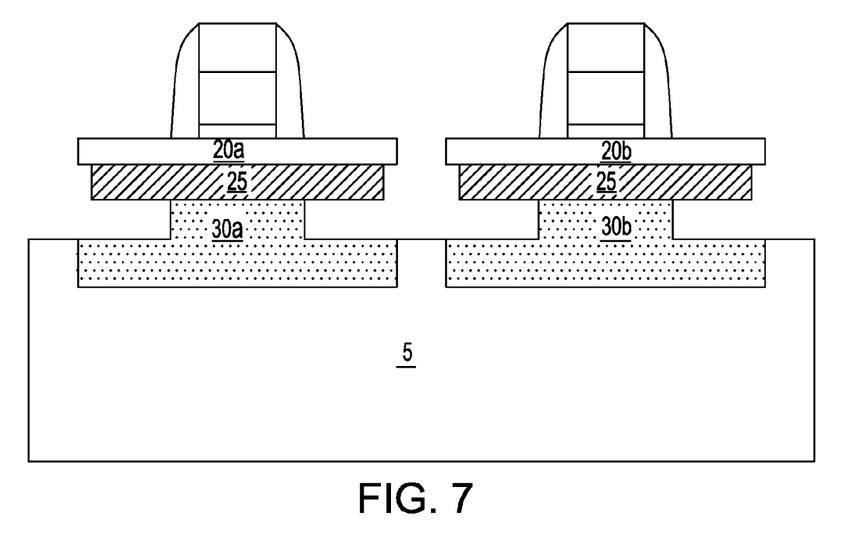
FIG. 7 illustrates a side cross-sectional view depicting one embodiment showing the implanted substrate region selectively etched to the non-implanted substrate to create a cavity self-aligned to the gate.

Next, the modified substrate region 40 is selectively etched as shown in FIG. 7 to create cavities self-aligned to the gate. The implanted Si can be removed by ammonia, ammonia-based etchant, e.g., tetramethyl ammonium hydroxide (TMAH), or a mixture of nitric and hydrofluoric acid. Alternatively, the implanted silicon may be removed by a dry etch process. For example, plasma containing fluorine or chlorine may be used to etch amorphous Si. Note that the implanted Si is etched at a much faster rate than the undoped Si (e.g., a selectivity >5:1).

Figure 8:
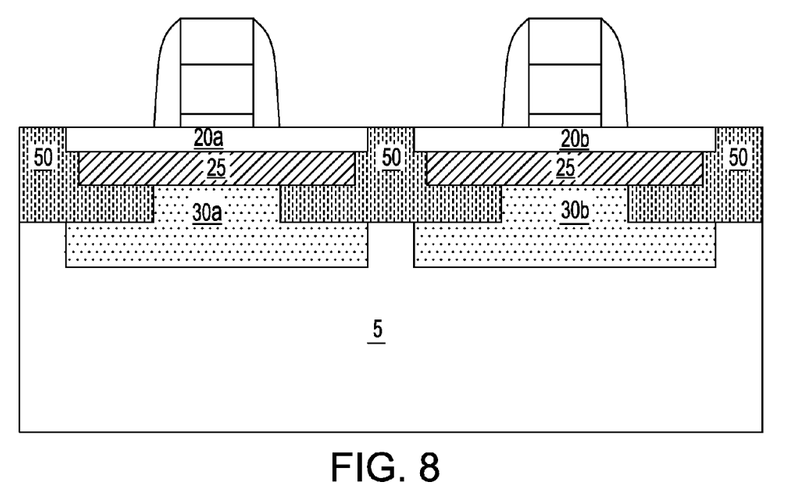
FIG. 8 is a side cross-sectional view depicting one embodiment of the invention illustrating filling the cavity with dielectric, e.g., silicon oxide deposited by spin-on-glass deposition-etch, and etch back.

Referring to FIG. 8, the cavities are then filled with insulating material 50 having a dielectric constant significantly smaller than that of substrate 5. Hence, the capacitance between the back gate 30 and the source and drain regions 11, 12 is significantly reduced. The insulating material includes silicon oxide, silicon nitride, silicon oxinitride, or a combination of those. The insulating material is preferably deposited by way of a conformal deposition method. For example, a cyclic deposition/etching of spin-on-glass (SOG) silicon dioxide and annealing can be advantageously used. Other methods that form conformally deposition of the dielectric can be used, e.g., by low pressure chemical vapor deposition (LPCVD), plasma-enhanced chemical vapor deposition (PECVD), or atomic layer deposition (ALD).

Figure 9:
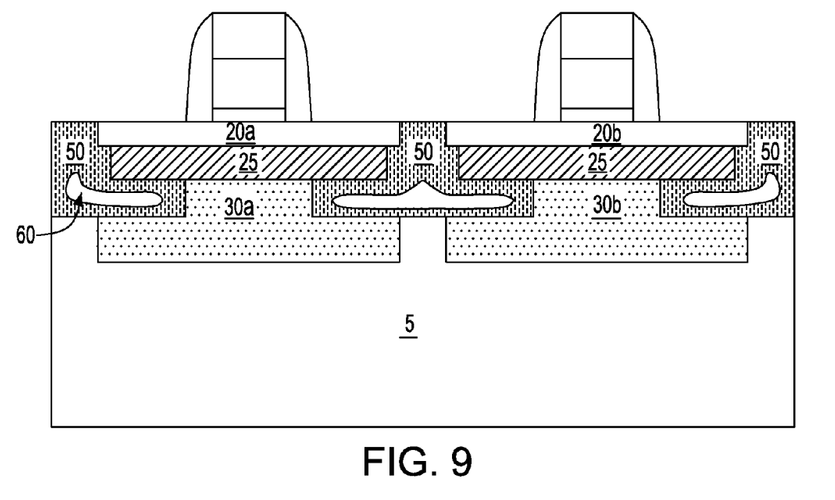
FIG. 9 is a side cross-sectional view depicting showing one embodiment having voids within the dielectric.

Alternatively, the deposition of the insulating material 50 can be performed with a combination of conformal and non-conformal deposition processes, so that a void 60 is formed within the insulation region 50, as shown in FIG. 9. The presence of the void further reduces the parasitic capacitance between the back gate 30 and source and drain regions 11, 12. The conformal/non-conformal deposition can be achieved by variations of the LPCVD, PECVD, and ALD.

Figure 10:
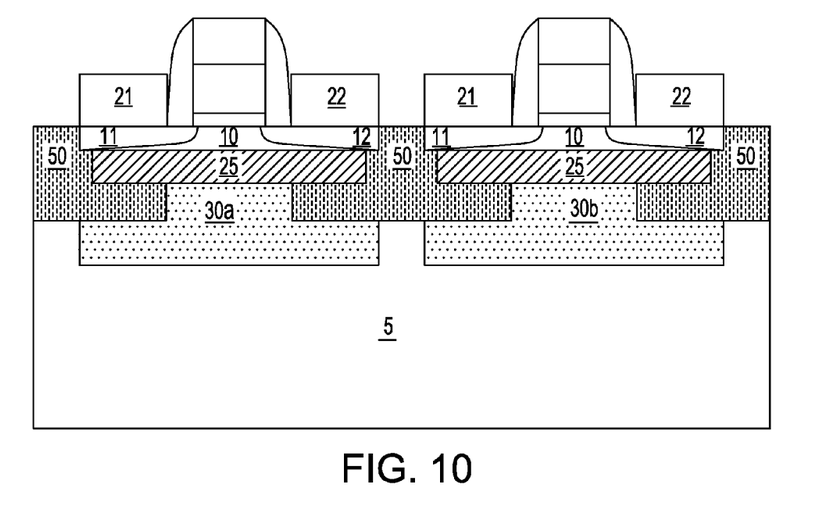
FIGS. 10 and 11 are side cross-sectional views depicting a final representation of the device, according to an embodiment of the present invention.
Figure 11:
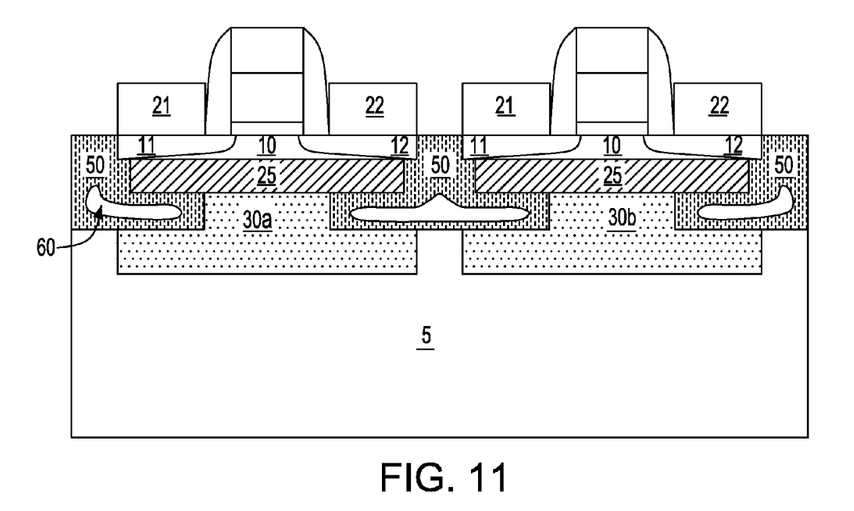

Referring to FIGS. 10 and 11, the process flow may continue as it is known in the art of CMOS technology by formation of the source and drain regions 11, 12 and, optionally, the raised source and drain regions 21, 22.

FIG. 10 depicts a final device structure according to an embodiment of the present invention, wherein the ETSOI transistor contains a thin buried insulator and a back gate structure formed underneath the buried insulator. A dielectric region is formed between the buried insulator and the back gate and in the region under the source and drain region 11, 12. The dielectric layer is self-aligned with the gate. The presence of the dielectric layer reduces the parasitic capacitance between the back gate and the source and drain regions when compared to the prior art structure shown in FIG. 1.

FIG. 11 depicts a final device structure according to another embodiment of the present invention where the ETSOI transistor contains a thin buried insulator and a back gate structure formed underneath the buried insulator. A dielectric region is formed between the buried insulator and the back gate and in the region under the source and drain region 11, 12. The dielectric layer is self-aligned to the gate and is shown containing a void. The presence of the void further reduces the parasitic capacitance between the back gate and the source and drain regions when compared to the structure shown in FIG. 10.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An extremely thin semiconductor-on-insulator (ETSOI) device comprising:
    a. a back gate layer on a substrate superimposed by a thin insulator buried oxide (BOX) layer having a thickness less than 30 nm;
    b. an ETSOI layer on top of said thin insulator BOX layer;
    c. a field effect transistor (FET) device on said ETSOI layer having a thickness ranging between 2 nm and 10 nm, provided with source and drain regions, and a gate stack insulated from a drain and a source by spacers; and
    d. a dielectric portion in said substrate and in a region directly beneath said source and said drain are self-aligned to said gate stack, wherein said source and drain regions are separated from said back gate layer by a combination of said thin insulator BOX layer and said dielectric portion,
    wherein said back gate layer has a thickness ranging between 20 nm and 200 nm and having an active dopant concentration exceeding $1 \times 10^{18}$ cm$^{-3}$.

2. The ETSOI device recited in claim 1, wherein said thin insulator BOX layer is underneath an ETSOI channel, and a dielectric underneath said source and said drain.

3. The ETSOI device recited in claim 2, further comprising cavities in selected regions within said substrate self-aligned to said gate stack and said ETSOI channel.

4. The ETSOI device recited in claim 3, wherein said gate electrode comprises materials made of metals, metal alloys, metal nitrides and metal silicides, laminates thereof and composites thereof.

5. The ETSOI device recited in claim 3, wherein a gate electrode comprises materials made of polysilicon or polysilicon-germanium alloy.

6. The ETSOI device recited in claim 2, further comprising voids in said dielectric portion self-aligned with said gate stack.

7. The ETSOI device recited in claim 6, wherein said voids within said dielectric portion are underneath said source and drain regions.

8. The ETSOI device recited in claim 1, further comprising in active regions, a gate dielectric, a gate electrode a gate cap and said spacers.

9. The ETSOI device recited in claim 8, further comprising a plurality of said active regions in said ETSOI layer that is insulated by mesa insulation, LOCOS, or shallow-trench isolation (STI).

10. The ETSOI device recited in claim 9, wherein a plurality of gate dielectric, gate electrode, gate cap and spacer regions are formed within said active regions.

11. The ETSOI device recited in claim 10, wherein, said gate is capped by a cap comprising one or more conductive layers.

12. The ETSOI device recited in claim 8, further comprising a plurality of back gate regions underneath said active regions.

13. The ETSOI device recited in claim 12, wherein said plurality of back gate regions include dopant ions within said substrate underneath said thin insulator BOX layer.

14. The ETSOI device recited in claim 13, wherein said dopant ions comprise arsenic and phosphorus as n-type dopants and boron and indium as p-type dopants.

15. The ETSOI device recited in claim 13, wherein different back gates are in different active regions.

16. The ETSOI device recited in claim 15, wherein said different back gates have a thickness ranging between 20 and 200 nm and an active dopant concentration greater than $1 \times 10^{18}$ cm$^{-3}$.

17. The ETSOI device recited in claim 8, wherein a shared back gate is used for more than one of said active region.

* * * * *